(12) United States Patent
Seely et al.

(10) Patent No.: US 6,275,111 B1
(45) Date of Patent: Aug. 14, 2001

(54) POWER AMPLIFIER HAVING TWO-DIMENSIONAL FET ARRAY

(75) Inventors: Warren L. Seely; Armando J. Mendoza, both of Chandler; John D. Goshinska, Jr., Gilbert, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/587,969

(22) Filed: Jun. 6, 2000

(51) Int. Cl.$^7$ .................................................. H03F 3/60
(52) U.S. Cl. .................................. 330/286; 330/295
(58) Field of Search .................................. 330/277, 286, 330/295, 307, 54, 124 R

(56) References Cited

U.S. PATENT DOCUMENTS

| | | | |
|---|---|---|---|
| 3,210,682 | 10/1965 | Sosin | 330/54 |
| 4,337,439 | 6/1982 | Sosin | 330/54 |
| 4,543,535 | 9/1985 | Ayasli | 330/53 |
| 4,769,618 | 9/1988 | Parish et al. | 330/277 |
| 4,853,649 | 8/1989 | Seino et al. | 330/277 |
| 4,929,913 | * 5/1990 | Sato | 330/277 |
| 5,166,640 | * 11/1992 | Fathimula et al. | 330/295 |
| 5,485,118 | 1/1996 | Chick | 330/54 |
| 5,736,908 | * 4/1998 | Alexanian | 330/286 |
| 6,028,483 | * 2/2000 | Shealy | 330/286 |
| 6,121,843 | * 9/2000 | Vampola et al. | 330/308 |

OTHER PUBLICATIONS

"A 1.4 Watt Q–Band GaAs PHEMT MMIC" by Stephen J. Nash et al., GaAs IC Symposium, Technical Digest 1997, Anaheim, CA, Oct. 12–15, 1997, 97CH36098, p. 283–286.

* cited by examiner

Primary Examiner—Robert Pascal
Assistant Examiner—Khanh Van Nguyen
(74) Attorney, Agent, or Firm—Gregory J. Gorrie; Frank J. Bogacz

(57) ABSTRACT

A two-dimensional FET array (102) within a Q-band power amplifier module is presented. Array (102) has a plurality of substantially identical one-dimensional FET arrays (106) substantially centered upon a primary axis (130) of two-dimensional array (106) substantially perpendicular to a propagation axis (110) of module (100). Each one-dimensional array (106) is formed of a plurality of FETs (128) substantially centered along a FET axis (134) substantially parallel to propagation axis (110). Each one-dimensional array (106) is proximate and coupled to each of an input bus (136) and an output bus (138), both oriented substantially parallel to propagation axis (110).

19 Claims, 2 Drawing Sheets

-PRIOR ART-  FIG. 1

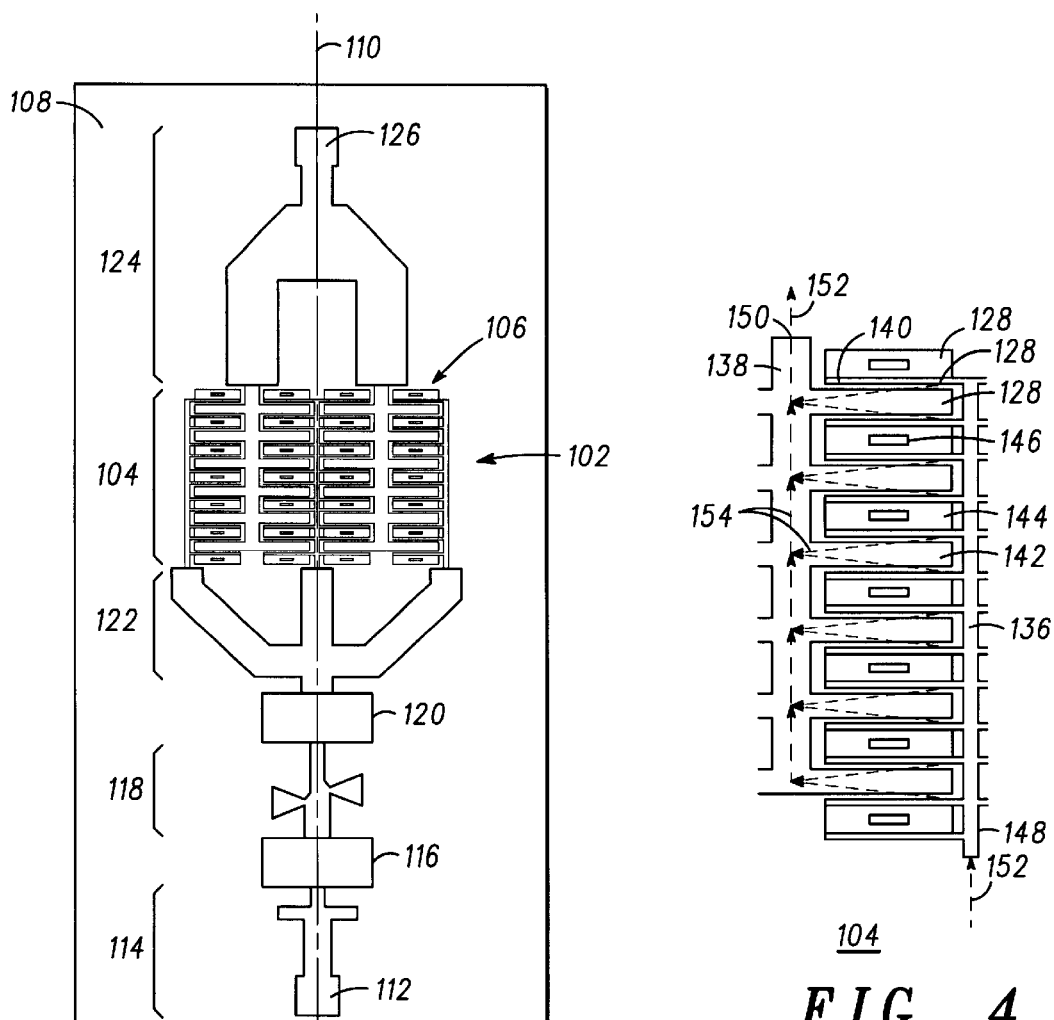
FIG. 2
FIG. 4
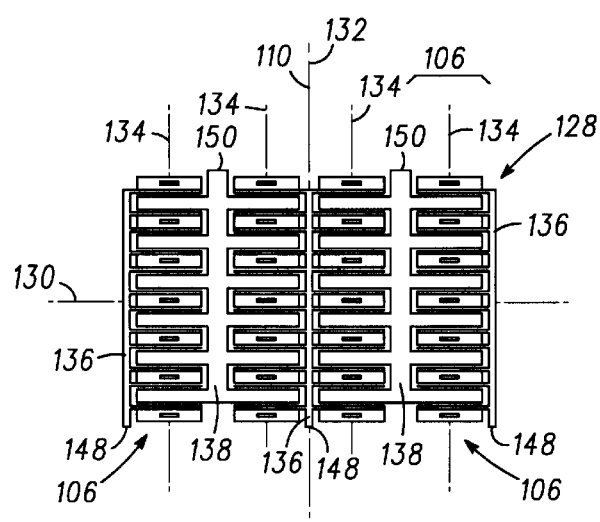
FIG. 3

POWER AMPLIFIER HAVING TWO-DIMENSIONAL FET ARRAY

TECHNICAL FIELD OF THE INVENTION

The present invention relates to the field of high frequency power amplifiers. More specifically, the resent invention relates to the field of millimeter-wave power amplifiers utilizing field-effect transistor (FET) arrays.

BACKGROUND OF THE INVENTION

In the design of satellite, portable, and other communication equipment, there is a continuing requirement to achieve greater transmission power in a smaller package and at a higher frequency. This requirement poses problems at high-microwave and millimeter-wave frequencies, and becomes crucial in transmitters operating in the Q band (i.e., at 40 GHz or greater).

To fulfil this requirement, millimeter-wave solid-state monolithic gallium arsenide (GaAs) power amplifiers utilizing higher electron mobility transistors have been developed. FIG. 1 shows a simplified plan sketch of a prior-art module 20 containing such a millimeter-wave power-amplifier.

In prior-art power-amplifier module 20, high power density was provided through the utilization of a large-periphery output stage 22. Output stage 22 achieves the desired power density without sacrificing high-frequency gain by using a linear (i.e., one-dimensional) array 24 of smaller linear arrays 26 of FETs 28. Even though this approach offers significant improvements over previous attempts, there still remained several distinct problems.

Each smaller linear array 26 has an input bus and an output bus. For each FET 28 in each smaller linear array 26, a gate couples to the input bus, a drain couples to the output bus, and a source couples to a common ground.

For each smaller linear array 26, the input bus has a single infeed point and the output bus has a single outfeed point. Impedance and layout difficulties restrict each smaller linear array 26 to being centrally coupled for both inputs and outputs. That is, the infeed point is centrally located on the input bus and the outfeed point is centrally located on the output bus. As a result, a signal propagating from the infeed point to the outfeed point for a given smaller linear array 26 must use signal paths of differing lengths through differing elements (i.e., through individual FETs 28) of the given smaller linear array 26. It may be appreciated that the distance from the infeed point to the outfeed point through centrally located FETs 28 is markedly shorter than that through peripherally located FETs 28. The signal therefore sustains differing amounts of phase shift for differing signal paths reducing the upper frequency limits of prior-art power-amplifier module 20.

The power output of output stage 22 is a function of the number of FETs 28 in linear array 24. The prior art utilizes linear array 24 of smaller linear arrays 26 of FETs 28. For a given number of FETs 28 per smaller linear array 26, the power output of output stage 22 is a function of the number of smaller linear arrays 26. To achieve a desired power output, it is often necessary to have several smaller linear arrays 26. Four such smaller linear arrays 26, each having twelve FETs 28, are depicted in FIG. 1.

Prior-art power-amplifier module 20 can be said to have a propagation axis 30 extending essentially in the general direction of signal flow. Linear array 24 of output stage 22 has an array axis 32 extending substantially perpendicularly to propagation axis 30. Each smaller linear array 26 has a FET axis 34 substantially coincident with array axis 32. The result is that linear array 24 extends across the general direction of signal flow, resulting in a wide monolithic GaAs chip 36. The length of GaAs chip 36 is a function of the signal processing components taken substantially serially over propagation axis 30. Overall, the width of linear array 24 results in GaAs chip 36 having a significant area. GaAs being expensive, this equates to a significant per-chip cost.

An input interface 38 is used to couple the input circuitry of module 20 to output stage 22 (i.e., the input busses of smaller linear arrays 26). Since each smaller linear array 26 has an individual infeed point, input interface 38 must interface the input circuitry to as many infeed points as there are smaller linear arrays 26. As a result, input interface 38 occupies a relatively large portion of the area of GaAs chip 36.

Similarly, an output interface 40 is used to couple output stage 22 (i.e., the output busses of smaller linear arrays 26) to an output of module 20. Since each smaller linear array 26 has an individual outfeed point, output interface 40 must interface as many outfeed points as there are smaller arrays to the output. As a result, output interface 40, too, occupies a relatively large portion of the area of GaAs chip 36.

What is needed, therefore, is a power amplifier possessing a sufficient number of FETs to achieve the desired power output. This amplifier, while having a large-periphery output stage, should have a minimal array-axis length so as to minimize GaAs chip area. Similarly, the output stage should be so configured as to reduce the number of infeed and outfeed points, thus reducing the size and complexity of the input and output interface and further reducing the requisite overall chip area. The lengths of the multiple paths of a signal propagating through the output stage should be as near to equal as possible, thus reducing phase difference and significantly extending upper frequency response.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 2 shows a simplified plan sketch of a millimeter-wave power-amplifier module in accordance with a preferred embodiment of the present invention;

FIG. 3 shows a simplified plan sketch of a two-dimensional FET array serving as an output stage of the power-amplifier module of FIG. 2 in accordance with a preferred embodiment of the present invention; and FIG. 4 shows a simplified plan sketch of a single one-dimensional FET array serving as an element of the two-dimensional FET array of FIG. 3 in accordance with a preferred embodiment of the present invention.

DETAILED DESCRIPTION OF THE PREFERRED EMBODIMENTS

Figure 1:
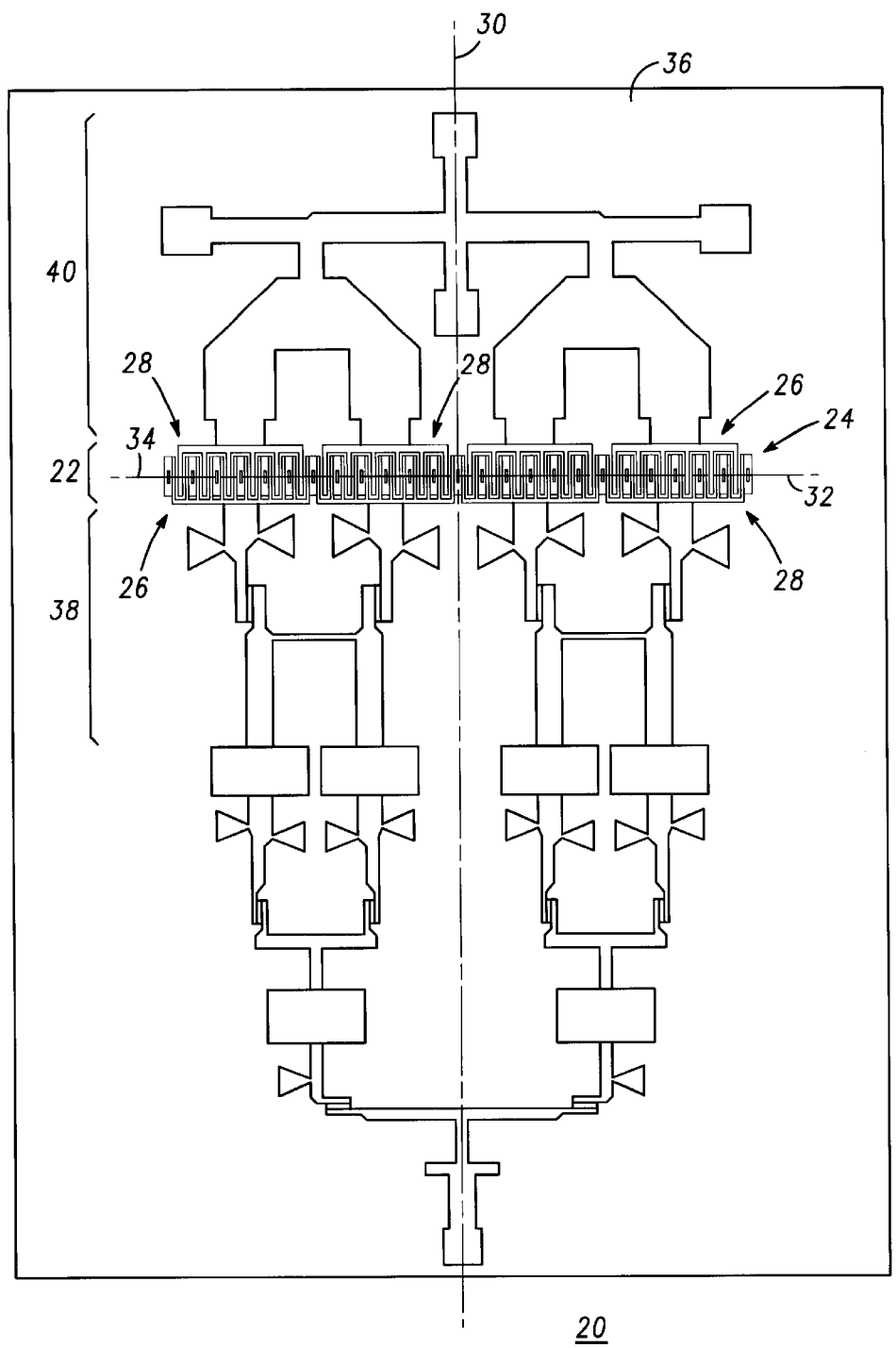
FIG. 1 shows a simplified plan sketch of a prior art millimeter-wave power-amplifier module.

In accordance with a preferred embodiment of the present invention, FIG. 2 depicts a simplified plan sketch of a millimeter-wave solid-state monolithic gallium arsenide (GaAs) power-amplifier module 100. FIG. 3 shows a simplified plan sketch of a two-dimensional FET array 102 serving as an output stage 104 of power-amplifier module 100. FIG. 4 shows a simplified plan sketch of a one-dimensional FET array 106 serving as an element of two-dimensional FET array 102. The following discussion refers to FIGS. 2 through 4. In accordance with the preferred embodiment of the present invention, metal-to-semiconductor field-effect transistors (MESFETs) and preferably pseudomorphic high-electron-mobility transistors (PHEMTs)may be used for FETs.

As depicted in FIG. 2, millimeter-wave power-amplifier module 100 is made up of a GaAs chip (substrate) 108 upon which several components have been formed along a propagation axis 110. Propagation axis 110 typically bisects GaAs chip 108, extending generally in the direction of signal flow. That is, a millimeter-wave signal (not shown) typically enters, propagates through, and exits power-amplifier module 100 along propagation axis 110. In the exemplary embodiment of FIG. 2, the signal typically enters power-amplifier module 100 at an input node 112. From input node 112, the signal propagates via a predriver interface 114 to a predriver amplifier 116. The signal is amplified within predriver amplifier 116. From predriver amplifier 116, the signal propagates via an inter-driver interface 118 to a driver amplifier 120. The signal is again amplified within driver amplifier 120. From driver amplifier 120, the signal propagates via an input interface 122 to output stage 104. In output stage 104, the power amplifier of power-amplifier module 100, the signal is amplified to its final power. From output stage 104, the signal propagates via an output interface 124 to output node 126, where the signal then leaves power-amplifier module 100.

Throughout this process, the signal remains substantially centered upon propagation axis 110. That is, each of components 112, 114, 116, 118, 120, 122, 104, 124, and 126 is itself substantially centered upon propagation axis 110. At points where the signal is divided into sub-signals during propagation, the totality of the signals at that point remains substantially centered upon propagation axis 110. Preferably, interface 122 provides three substantially in-phase signals to output stage 104.

Each component is only substantially (i.e., approximately) centered upon propagation axis 110. Those skilled in the art will appreciate that a given component may vary somewhat from a true centering because of layout or other considerations. Such variations in centering do not depart from the spirit of the present invention.

While depicted in the exemplary embodiment of FIG. 2, predriver amplifier 116 is not a requirement of the present invention. Those skilled in the art will appreciate that predriver amplifier 116 and, to a lesser degree, driver amplifier 120, may not be incorporated into all embodiments of the present invention. Neither the inclusion nor the omission of predriver amplifier 116, either alone or in conjunction with driver amplifier 120, departs from the spirit of the present invention.

Output stage 104 meets the requirements of a large-periphery output stage. This is accomplished by utilizing FET elements 128 forming output stage 104 as two-dimensional FET array 102. PHEMTs are preferably used as FET elements 128.

Two-dimensional FET array 102 has a primary axis 130 (FIG. 3) substantially perpendicular to propagation axis 110, and a secondary axis 132 (FIG. 3) substantially coincident with propagation axis 110. Two-dimensional array 102 is formed of a plurality of substantially identical elements, each of which is one one-dimensional FET array 106. The elements (one-dimensional FET arrays 106) of two-dimensional array 102 extend along primary array axis 130. That is, primary array axis 130 passes through each one-dimensional FET array 106 in two-dimensional FET array 102.

Each one-dimensional FET array 106 has a FET axis 134 extending substantially perpendicular to primary array axis 130, i.e., substantially parallel to propagation axis 110. Each one-dimensional FET array 106 is formed of a plurality of substantially identical elements, each of which is one FET 128. The elements (FETs 128) of one-dimensional array 106 extend along FET axis 134. That is, FET axis 134 passes through each FET 128 in one-dimensional FET array 106.

The power output of output stage 104, i.e., of power-amplifier module 100 is a function of the number of FETs 128 in two-dimensional FET array 102. That is, the power output of output stage 104 is a function of the number of FETs 128 in each one-dimensional FET array 106 and the number of one-dimensional FET 106 arrays in two-dimensional array 102.

Typically, each one-dimensional array 106 is formed of a like number of substantially identical FETs 128. Those skilled in the art will appreciate that, under special circumstances, it may be desirable to produce two-dimensional FET array 102 from one-dimensional FET arrays 106 not having identical numbers of FETs 128, or where not all FETs 128 in a given one-dimensional array 106 are identical. Since one-dimensional arrays 106 need only be substantially identical, such variations would be within the spirit of the present invention.

Because two-dimensional FET array 102 is two dimensional, a given number of FETs 128 (for a given power) require less width of GaAs chip 108 than the prior art (compare FIGS. 1 and 2). This may be realized as an increase in the number of chips per wafer and a significant reduction in per-chip production cost.

Each one-dimensional array 106 is formed of a plurality of FETs 128 bracketed by an input bus 136 and an output bus 138. Input and output busses 136 and 138 are proximate array 106 and oriented substantially parallel to FET axis 134, i.e., substantially perpendicular to primary array axis 130 and substantially parallel to propagation axis 110. Alternate one-dimensional arrays 106 are mirrors of each other sharing a common input bus 136 or output bus 138 between them. This causes each one-dimensional array 106 to be proximate one input bus 136 and one output bus 138, thereby effecting a minimal number of each of input busses 136 and output busses 138 for a given number of arrays 106.

For example, in the four one-dimensional FET arrays 106 of the exemplary embodiment of FIGS. 2 and 3, left input bus 136 couples to leftmost array 106, left output bus 138 couples to the left two arrays 106, central input bus 136 couples to the central two arrays 106, right output bus 138 couples to the right two arrays 106, and right input bus 136 couples to rightmost array 106. In this manner, all four arrays 106 are served by only three input busses 136 and two output busses 138.

Those skilled in the art will appreciate that this approach allows "N" arrays 106 to be served by "(N/2)+1" input busses 136 and "N/2" output busses 138, or vice versa, when "N" is an even integer, or by "(N+1)/2" input busses 136 and "(N+1)/2" output busses 138 when "N" is an odd integer. Variations in this scheme do not depart from the spirit of the present invention.

For each FET 128 in each one-dimensional array 106, a gate 140 couples to its proximate input bus 136, a drain 142 couples to its proximate output bus 138, and a source 144 couples to a common ground 146, for example through the substrate to a ground plane.

For a single one-dimensional FET array 106, input bus 136 has a single infeed point 148 and output bus 138 has a single outfeed point 150 (FIG. 4). Because input and output busses 136 and 138 are substantially parallel to propagation axis 110, the connections between input and output busses 136 and 138 and input and output interfaces 122 and 124 pose fewer layout and stability problems than those encountered by prior-art amplifiers. As a result, infeed and outfeed points 148 and 150 are located at opposing ends of input and output busses 136 and 138, respectively, with infeed point 148 be more proximate to input node 112 and outfeed point 150 being more proximate to output node 126. That is, one-dimensional array 106 has a first FET 128 at one end of array 106 and a last FET 128 at an opposite end of array 106. Infeed point 148 is more proximate gate 140 of first FET 128 than gate 140 of any other FET 128 in array 106. Similarly, outfeed point 150 is more proximate drain 142 of last FET 128 than drain 142 of any other FET 128 in array 106.

A millimeter-wave signal 152 propagating from an infeed point 148 to its corresponding outfeed point 150 uses signal paths 154 of substantially equal lengths through differing elements of array 106 (i.e., through individual FETs 128). This is demonstrated in FIG. 4, wherein the distance from infeed point 148 to outfeed point 150 through any FET 128 is substantially equal to that through any other FET 128. Signal 152 therefore sustains substantially equal amounts of phase shift for all signal paths 154. This produces a signal substantially free of phase difference, which extends the upper frequency limits of millimeter-wave power-amplifier module 100 over that of the prior art.

Those skilled in the art will appreciate that alternate FETs 128 have very slightly different lengths of signal paths 154. This discrepancy is so slight (one FET junction width) as to place only an insignificant barrier to the upper frequency limit within the current state of the art for GaAs technology.

Because there are fewer infeed and outfeed points 148 and 150 for a given number of FETs, input and output interfaces 122 and 124 may be simpler and more direct than that of the prior art. This reduction in complexity may extend to other components of power amplifier module 100, e.g., driver amplifier 120, inter-driver interface 118, predriver amplifier 116, and predriver interface 114. This may result in a reduction in the length of GaAs chip 108 over that required of the prior art (compare FIGS. 1 and 2). This, too, may be realized as an increase in the number of chips per wafer and a significant reduction in per-chip production cost.

In summary, the present invention teaches a millimeter-wave monolithic GaAs FET power amplifier module 100 possessing a sufficient number of FETs 128 to achieve a desired power output. Power-amplifier 100, while having a large-periphery output stage 104, has a minimal GaAs chip width requirement. This in turn reduces the requisite width of a GaAs chip 108 for module 100. Similarly, output stage 104 is so configured as to reduce the number of infeed and outfeed points 148 and 150, reducing the size and complexity of input and output interfaces 122 and 124. This in turn reduces the requisite length of GaAs chip 108. GaAs chip 108 is therefore reduced in total area, effecting a significant reduction in production cost thereof. The lengths of the multiple paths 154 of a signal 152 propagating through output stage 104 are substantially equal, thus reducing phase difference and extending upper frequency response of power amplifier module 100.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A two-dimensional field-effect transistor (FET) array configured as a millimeter-wave power amplifier, said two-dimensional FET array comprising:

a plurality of substantially identical one-dimensional FET arrays, wherein each of said one-dimensional FET arrays is formed of a plurality of FET elements extending in a first direction, and wherein said plurality of said one-dimensional FET arrays extends in a second direction substantially perpendicular to said first direction;

an input bus oriented in substantially said first direction proximate to one of said one-dimensional FET arrays; and an output bus oriented in substantially said first direction proximate to said one of said one-dimensional FET arrays.

2. A two-dimensional FET array as claimed in claim 1 wherein each of said one-dimensional FET arrays is formed of a like number of said FET elements.

3. A two-dimensional FET array as claimed in claim 1 wherein a gate of each of said FET elements of said one of said one-dimensional FET arrays is coupled to said input bus.

4. A two-dimensional FET array as claimed in claim 3 wherein:

said input bus is one of a plurality of input busses oriented in substantially said first direction;

each of said one-dimensional FET arrays is proximate to one of said input busses; and a gate of each of said FET elements of each of said one-dimensional FET arrays couples to a proximate one of said input busses.

5. A two-dimensional FET array as claimed in claim 1 wherein a drain of each of said FET elements of said one of said one-dimensional FET arrays is coupled to said output bus.

6. A two-dimensional FET array as claimed in claim 5 wherein:

said output bus is one of a plurality of output busses oriented in substantially said first direction;

each of said one-dimensional FET arrays is proximate to one of said output busses; and a drain of each of said FET elements of each of said one-dimensional FET arrays couples to a proximate one of said output busses.

7. A two-dimensional FET array as claimed in claim 1 additionally comprising:

an infeed point upon said input bus, wherein a gate of each of said FET elements of said one of said one-dimensional FET arrays is coupled to said input bus;

an outfeed point upon said output bus, wherein a drain of each of said FET elements of said one of said one-dimensional FET arrays is coupled to said output bus; and a plurality of signal paths for a signal progressing from said infeed point to said outfeed point, wherein each of said signal paths passes through an individual one of said FET elements of said one of said one-dimensional FET arrays, and wherein each of said signal paths imposes a substantially identical phase shift upon said signal.

8. A two-dimensional FET array as claimed in claim 1 wherein:
each of said one of said one-dimensional FET arrays has a first FET element at a first end thereof and a last FET element at a second end thereof;
said two-dimensional FET array additionally comprises an infeed point at an end of said input bus proximate said first FET element of said one of said one-dimensional FET arrays, wherein a gate of each of said FET elements of said one of said one-dimensional FET arrays is coupled to said input bus;
said two-dimensional FET array additionally comprises an outfeed point at an end of said output bus proximate said last FET element of said one of said one-dimensional FET arrays, wherein a drain of each of said FET elements of said one of said one-dimensional FET arrays is coupled to said output bus; and
a signal progresses from said infeed point to said outfeed point over an individual signal path for each of said FET elements of said one of said one-dimensional FET arrays, and wherein said signal undergoes a substantially identical phase shift for each of said individual signal paths.

9. A two-dimensional FET array as claimed in claim 1 wherein:
said input bus is one of a plurality of input busses;
said input busses are positioned so that each of said one-dimensional FET arrays is proximate one of said input busses;
said output bus is one of a plurality of output busses; and
said output busses are positioned so that each of said one-dimensional FET arrays is proximate one of said output busses.

10. A millimeter-wave power-amplifier module having a propagation axis, said power-amplifier module comprising:
an output interface substantially centered on said propagation axis;
a two-dimensional field-effect transistor (FET) array configured as a power amplifier, coupled to said output interface, and substantially centered on said propagation axis;
an input interface coupled to said FET two-dimensional-FET array, and substantially centered upon said propagation axis; and
a driver amplifier coupled to said input interface, and substantially centered upon said propagation axis.

11. A power-amplifier module as claimed in claim 10 wherein:
said two-dimensional FET array comprises a plurality of substantially identical one-dimensional FET arrays;
each of said one-dimensional FET arrays comprises elements extending in a direction substantially parallel to said propagation axis; and
said plurality of one-dimensional FET arrays extends in a direction substantially perpendicular to said propagation axis.

12. A power-amplifier module as claimed in claim 11 wherein said two-dimensional FET array additionally comprises:
an input bus coupled to one of said one-dimensional FET arrays, wherein said input bus is oriented substantially parallel to said propagation axis and has an input end coupled to said input interface; and
an output bus coupled to said one of said one-dimensional FET arrays, wherein said output bus is oriented substantially parallel to said propagation axis and has an output end coupled to said output interface.

13. A power-amplifier module as claimed in claim 11 wherein said two-dimensional FET array additionally comprises:
at least one output bus oriented substantially parallel to said propagation axis, coupled to said -output interface, and positioned so that each of said one-dimensional FET arrays is proximate and coupled to one output bus; and
at least one input bus oriented substantially parallel to said propagation axis, coupled to said input interface, and positioned so that each of said one-dimensional FET arrays is proximate and coupled to one input bus.

14. A power-amplifier module as claimed in claim 11 wherein:
said two-dimensional FET array additionally comprises a plurality of output busses coupled to said output interface, wherein said output busses are configured so that each of said one-dimensional FET arrays is proximate and coupled to one of said output busses; and
a drain of each of said FET elements of each of said one-dimensional FET arrays couples to said output bus to which said each one-dimensional FET array is proximate.

15. A power-amplifier module as claimed in claim 11 wherein:
said two-dimensional FET array additionally comprises a plurality of input busses coupled to said input interface, wherein said input busses are configured so that each of said one-dimensional FET arrays is proximate and coupled to one of said input busses; and
a gate of each of said FET elements of each of said one-dimensional FET arrays couples to said input bus to which said each one-dimensional FET array is proximate.

16. A power-amplifier module as claimed in claim 11 wherein:
said power-amplifier module additionally comprises a signal-input node;
said power-amplifier module additionally comprises a signal-output node;
said two-dimensional FET array additionally comprises an input bus proximate each of said one-dimensional FET arrays, and wherein a gate of each of said FET elements of each of said one-dimensional FET arrays is coupled to said proximate input bus;
said two-dimensional FET array additionally comprises an output bus proximate each of said one-dimensional FET arrays, and wherein a drain of each of said FET elements of each of said one-dimensional FET arrays is coupled to said proximate output bus;
a signal entering said input node passes through all of said FET elements of all of said one-dimensional FET arrays of said two-dimensional FET array to arrive at said output node;
said signal traverses a unique signal path for each of said FET elements; and
said signal undergoes a substantially equal phase shift between said input node and said output node for each of said unique signal paths.

17. A two-dimensional field-effect transistor (FET) array configured as a Q-band power amplifier having a propagation axis, said two-dimensional FET array comprising:
a plurality of substantially identical one-dimensional FET arrays substantially centered upon a two-dimensional FET array axis substantially perpendicular to said propagation axis, wherein each of said one-dimensional FET arrays is formed of a plurality of FET elements substantially centered along a one-dimensional FET array axis substantially parallel to said propagation axis;

a plurality of input busses oriented substantially parallel to said propagation axis; and a plurality of output busses oriented substantially parallel to said propagation axis.

18. A two-dimensional FET array as claimed in claim 17 wherein:

each of said one-dimensional FET arrays is proximate and coupled to one of said input busses; and each of said one-dimensional FET arrays is proximate and coupled to one of said output busses.

19. A two-dimensional FET array as claimed in claim 18 additionally comprising:

an infeed point upon one of said input busses, wherein a gate of each of said FET elements of a proximate one of said one-dimensional FET arrays is coupled to said one of said input bus;

an outfeed point upon one of said output busses, wherein a drain of each of said FET elements of said proximate one of said one-dimensional FET arrays is coupled to said one of said output bus; and a plurality of signal paths for a signal progressing from said infeed point to said outfeed point, wherein each of said signal paths passes through an individual one of said FET elements of said one of said one-dimensional FET arrays, and wherein each of said signal paths imposes a substantially identical phase shift upon said signal.

* * * * *